United States Patent [19]
Wentworth

[11] Patent Number: 5,373,984
[45] Date of Patent: Dec. 20, 1994

[54] REFLOW PROCESS FOR MIXED TECHNOLOGY ON A PRINTED WIRING BOARD

[75] Inventor: Dana D. Wentworth, Rockford, Ill.

[73] Assignee: Sundstrand Corporation, Rockford, Ill.

[21] Appl. No.: 127,397

[22] Filed: Sep. 27, 1993

[51] Int. Cl.$^5$ .............................................. H05K 3/34
[52] U.S. Cl. ..................... 228/180.1; 228/180.21; 228/248.1; 228/56.3
[58] Field of Search ............... 228/175, 180.1, 180.21, 228/180.22, 246, 248.1, 56.3

[56] References Cited

U.S. PATENT DOCUMENTS

| | | | |
|---|---|---|---|
| 4,515,304 | 5/1985 | Berger | 228/234.2 |
| 4,573,105 | 2/1986 | Beldavs | 228/180.22 |
| 4,600,136 | 7/1986 | Comerford | 228/180.1 |
| 4,722,470 | 2/1988 | Johary | 328/180.2 |
| 4,739,919 | 4/1988 | Van Den Brekel et al. | 228/180.1 |
| 4,761,881 | 8/1988 | Bora et al. | 228/180.1 |
| 4,851,966 | 7/1989 | Roback et al. | 228/56.3 |
| 4,998,342 | 3/1991 | Bonnell et al. | 228/180.1 |
| 5,029,748 | 7/1991 | Lauterbach et al. | 228/180.1 |
| 5,129,573 | 7/1992 | Duffey | 228/180.1 |
| 5,155,904 | 10/1992 | Majd | 228/180.1 |
| 5,167,361 | 12/1992 | Liebman et al. | 228/180 |

OTHER PUBLICATIONS

An article in the Mid-Aug., 1993 issue of Electronic Packaging & Production entitled "Avionics Challange Met with Mixed Technology" written by Dana Wentworth and Ian Tinkler.

*Primary Examiner*—Samuel M. Heinrich
*Attorney, Agent, or Firm*—Kristin L. Chapman; Jeffery J. Makeever

[57] ABSTRACT

This invention relates to a method of combining a plurality of surface mount technology components and at least one plated through-hole component on a printed wiring board. The method includes applying to a secondary side of the printed wiring board a first layer of a preselected quantity of electrically conductive adhesive and then attaching a first portion of the plurality of the surface mount technology components to the adhesive. The first layer of the adhesive is then reflowed, thereby adhering the first portion of the plurality of surface mount technology components to the secondary side of the printed wiring board. The method then continues by applying to a primary side of the printed wiring board a second layer of the first preselected quantity of electrically conductive adhesive and applying to the primary side of the printed wiring board a second preselected quantity of electrically conductive adhesive. Next, a second portion of the plurality of surface mount technology components are attached to the second layer of the first adhesive and a plated through-hole component is attached to the second adhesive applied to the primary side of the printed wiring board. Finally, the second layer of the first adhesive and the second preselected quantity of electrically conductive adhesive applied to the primary side of the printed wiring board is reflowed, thereby adhering the second portion of the plurality of surface mount technology components and a plated through-hole component to the primary side of the printed wiring board.

17 Claims, 11 Drawing Sheets

REFLOW PROCESS FOR MIXED TECHNOLOGY ON A PRINTED WIRING BOARD

FIELD OF THE INVENTION

This invention relates to a method of combining a plurality of surface mount technology components and at least one plated through-hole component on a printed wiring board.

BACKGROUND ART

Advanced power electronic designs, especially those of aircraft generating systems, are currently challenged to meet more stringent design requirements, lower cost constraints and higher quality standards. To achieve these objectives, printed wiring boards are taking advantage of the smaller component size offered by surface mount technology components. However, some components are not yet available in an appropriate surface mount technology format and must be obtained as plated through-hole components. Designers are forced, therefore, to utilize components of mixed technology in the design of printed wiring boards.

The manufacturing of such mixed technology printed wiring boards containing both surface mount technology components and plated through-hole components typically involve a reflow soldering process followed by a wave soldering process. However, because of increased design performance requirements and more dense packaging of components, surface mount technology components may appear on both sides of a printed wiring board. This poses a problem because a reflow soldering process is not compatible with a wave soldering process when surface mount technology components appear on both sides of a printed wiring board. This non-compatibility necessitates a manual placement of the plated through-hole components, which is an extremely laborious task, magnifying the cost associated with manufacturing these mixed technology units.

The objective of providing surface mount technology components to both sides of a printed wiring board is addressed in a patent to Leibman et al., U.S. Pat. No. 5,167,361, which discloses a method of forming solder bumps on contact areas of both sides of the printed wiring board in a predetermined pattern. The solder paste is then reflowed and the solder joints on the first side are flattened. Tack media is then dispensed onto the joint areas for the subsequent placement of surface mount technology components on one side of the printed wiring board. A conventional reflowing process is again utilized to mount these components on the one side of the board. Subsequently, a second side of the printed wiring board is treated in the same manner as the one side of the board before surface mount technology components are mounted, after which the board is reflowed again. While the patent to Leibman et al. addresses mounting of surface mount technology components to a printed wiring board, it does not, as the invention to be described more fully hereinafter, avoid the binding between fine-pitched surface mount technology components, which results in short circuiting of the printed wiring board. Furthermore, the present disclosure eliminates the repeated reflow step before attaching surface mount technology components.

The problem of mounting surface mount technology components is also addressed in a patent to Johary, U.S. Pat. No. 4,722,470. The Johary patent teaches a method for applying discrete bodies of solder of predetermined size to leads of a component for subsequent surface mounting to a substrate by employing a solder transfer member. The transfer member is a plate having a non-wetted surface with an array of cavities matching the component lead pattern. The method includes placing solder paste on the transfer member and filling the cavities by wiping the plate surface. The component is then placed on the transfer member with the leads contacting the solder paste in the cavities. Reflow of the solder paste bonds to each lead a discrete body of solder having a precisely determined size. While the Johary patent addresses the problem of bridging of solder and the consequent short circuiting between adjacent solder joints, it is not directed, as the present invention, to combining both surface mount technology components and plated through-hole components on the same board. In addition, the method disclosed in the Johary patent incorporates directly placing solder on the leads of a component member rather than, as the invention described more fully hereinafter, directly applying a predetermined amount of solder to a printed wiring board.

Casting solder preforms into an array such that a plurality of preforms are initially formed as a single unit is disclosed in the patent to Lauterbach et al., U.S. Pat. No. 5,029,748. The solder preforms are either cast onto pins of a plated through-hole component or cast onto a separate carrier for subsequent insertion onto the pins of a plated through-hole component. While the Lauterbach et al. patent addresses the incompatibility of manufacturing processes associated with hybrid printed wiring boards, it does not, as the invention to be described more fully hereinafter, address the problem of sharing solder between adjacent joints of a component through the inconsistent manual placement of solder preforms. Such manual placement of solder preforms into an array takes away the precise control needed for fine pitched surface mount technology components.

The present invention is directed to overcoming one or more of the above problems.

SUMMARY OF INVENTION

More specifically, this invention relates to a method of combining a plurality of surface mount technology components and at least one plated through-hole component on a printed wiring board. The method includes applying to a secondary side of the printed wiring board a first layer of a preselected quantity of electrically conductive adhesive and then attaching a first portion of the plurality of surface mount technology components to the first layer of the first preselected quantity of electrically conductive adhesive. The first layer of the first preselected quantity of electrically conductive adhesive is then reflowed, thereby adhering the first portion of the plurality of surface mount technology components to the secondary side of the printed wiring board. The method then continues by applying to a primary side of the printed wiring board a second layer of the first preselected quantity of electrically conductive adhesive and also applying to the primary side of the printed wiring board a second preselected quantity of electrically conductive adhesive. Next, a second portion of the plurality of surface mount technology components are attached to the second layer of the first preselected quantity of electrically conductive adhesive and a plated through-hole component is attached to the second preselected quantity of electrically conductive adhesive applied to the primary side of the printed wiring board. Finally, the second layer of the first preselected quantity of electrically conductive adhesive and the second preselected quantity of electrically conductive adhesive applied to the primary side of the printed wiring board is reflowed, thereby adhering the second portion of the plurality of surface mount technology components and a plated through-hole component to the primary side of the printed wiring board. It is therefore a primary object of the invention to provide a reflow process for a printed wiring board containing both surface mount technology components and at least one plated through-hole component.

Another object of this invention is to provide in the steps of applying the first layer and the second layer of the first preselected quantity of electrically conductive adhesive to the secondary side and the primary side, respectively, of the printed wiring board, a first patterned layer solder, respectively, and a second patterned layer of solder wherein the second patterned layer of solder includes applying a plurality of axially symmetric C-shaped deposits as a portion of the second patterned layer of solder.

Yet another object of this invention is to utilize in the step of applying a second layer of the first preselected quantity of electrically conductive adhesive, a portion of the first preselected quantity of electrically conductive adhesive to retain the second preselected quantity of electrically conductive adhesive to the primary side of the printed wiring board.

Yet another object of this invention is to provide a tape having a plurality of sequentially spaced receptors located therein, to dispose a plurality of preformed solder disks within the plurality of sequentially spaced receptors, and to supply the tape having the plurality of preformed solder disks disposed within the plurality of sequentially spaced receptors to an apparatus for placing the plurality of preformed solder disks on the printed wiring board.

In the attainment of the foregoing objects, the invention contemplates in its preferred embodiment, a method of combining a plurality of surface mount technology components and at least one plated through-hole component on a printed wiring board.

The method includes applying to a secondary side of the printed wiring board a first patterned layer of solder and attaching a first portion of the plurality of surface mount technology components to the first patterned layer of solder. The first patterned layer of solder applied to the secondary side of the printed wiring board is then reflowed, thereby adhering the first portion of the plurality of surface mount technology components to the secondary side of the printed wiring board.

The method further includes applying to a primary side of the printed wiring board a second patterned layer of solder and also applying to the primary side of the printed wiring board a plurality of preformed solder disks, wherein the step of applying the second patterned layer of solder includes utilizing a portion of the second patterned layer of solder to retain the plurality of preformed solder disks to the primary side of the printed wiring board.

The method further includes attaching a second portion of the plurality of surface mount technology components to the second patterned layer of solder and the plated through-hole component to the plurality of preformed solder disks applied to the primary side of the printed wiring board.

The method further includes reflowing the second patterned layer of solder and the plurality of preformed solder disks applied to the primary side of the printed wiring board, thereby adhering the second portion of the plurality of surface mount technology components and the plated through-hole component to the primary side of the printed wiring board.

The method further includes providing a tape having a plurality of sequentially spaced receptors located therein, disposing a plurality of preformed solder disks within the plurality of sequentially spaced receptors, and supplying the tape having the plurality of preformed solder disks disposed within the plurality of sequentially spaced receptors to an apparatus for placing the plurality of preformed solder disks on the printed wiring board.

Other objects and advantages of the present invention will be apparent upon reference to the accompanying description when taken in conjunction with the following drawings.

BRIEF DESCRIPTION OF THE DRAWINGS

While the specification concludes with claims particularly pointing out and distinctly claiming that which is regarded as the present invention, the organization, the advantages, and further objects of the invention may be readily ascertained by one skilled in the art from the following detailed description when read in conjunction with the accompanying drawings in which:

DESCRIPTION OF THE PREFERRED EMBODIMENTS

Figure 1:
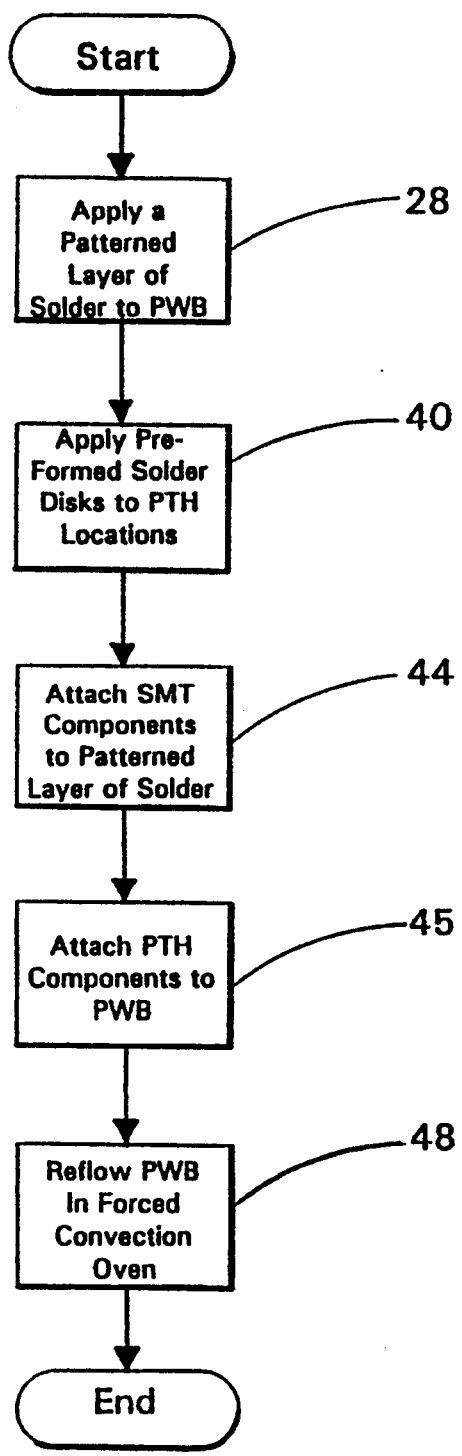
FIG. 1 is a process flow diagram of an embodiment of the instant invention illustrating a method of combining a plurality of surface mount technology components and at least one plated through-hole component on a printed wiring board.

FIG. 1 illustrates a process flow diagram of a method of combining a plurality of surface mount technology components 20 (see FIG. 8) and at least one plated through-hole component. 22 on a side 24 of a printed wiring board 26 in accordance with the present invention.

Figure 7:
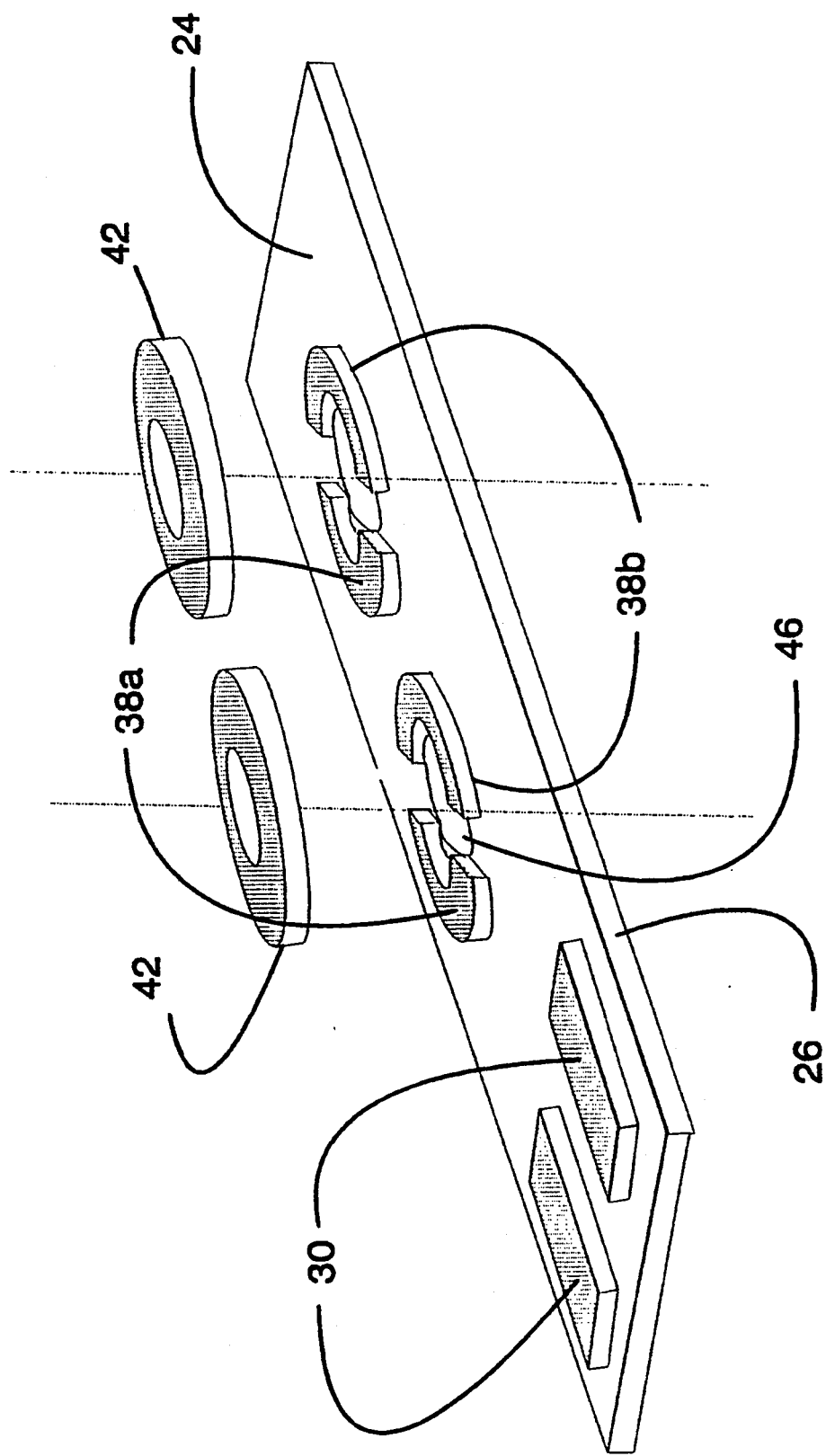
FIG. 7 is a three dimensional partial view of a patterned layer of solder paste applied in accordance with the instant invention.

As illustrated in FIG. 1, the first step 28 in the process comprises applying to a side 24 (FIG. 8) of the printed wiring board 26 a first preselected quantity of electrically conductive adhesive, such as a patterned layer of solder paste 30 as shown in FIG. 7. The solder paste, preferably rosin-mildly-activated (RMA) solder paste of approximately 90 percent metal content, although higher or lower concentrations may be appropriate based on the specific application, is applied using a stencil 32 (see FIG. 5). The stencil 32, preferably constructed from micro-polished stainless steel, has apertures 16 which allow for the solder paste to be deposited in the appropriate surface mount technology component locations. The stencil 32 further defines two axially symmetric "C" shaped apertures 36a, 36b, as shown in more detail in FIG. 3, which allow the plated through-hole component hole locations to receive two axially symmetric "C" shaped deposits of solder paste 38a, 38b (see FIG. 7) on their annular rings.

The second step 40 in the process of the instant invention as illustrated in FIG. 1 comprises applying to the same side 24 of the printed wiring board 26 (see FIG. 8) a second preselected quantity of electrically conductive adhesive, such as a plurality of preformed solder disks 42 (see FIG. 7). These preformed solder disks 42 are placed at the appropriate through-hole locations on top of the two "C" shaped deposits 38 of the solder paste, which provides the "tack" to allow the preforms to remain in position. That is to say, a portion of the first preselected quantity of electrically conductive adhesive is utilized to retain the second preselected quantity of electrically conductive adhesive to the same side 24 (FIG. 8) of the printed wiring board 26.

In the next step 44, as illustrated in FIG. 1, the plurality of surface mount technology components 20 (FIG. 8) are attached to the solder paste at the appropriate location on the printed wiring board 26. The plated through-hole component 22 is also attached to the appropriate location on the printed wiring board 26 by inserting its leads through the preformed solder disks 42 (FIG. 7) and into the hole 46 on the printed wiring board 26 as shown in step 45 of FIG. 1.

In the final step 48 of the process as illustrated in FIG. 1, the printed wiring board 26 is then reflowed through, for example, a forced convection oven (not shown); although, other reflow methods, such as infrared or vapor-phase reflowing, may be employed as appropriate to the specific application. This reflow process step 48 adheres the plurality of surface mount technology components 20 (see FIG. 8) and the plated through-hole component 22 to the same side 24 of the printed wiring board 26. The preferred reflow profile requires a minimum dwell time above liquidus of approximately 60 seconds with a minimum temperature of approximately 220° C. and a maximum temperature of approximately 230° C. at any point on the printed wiring board 26.

Figure 2:
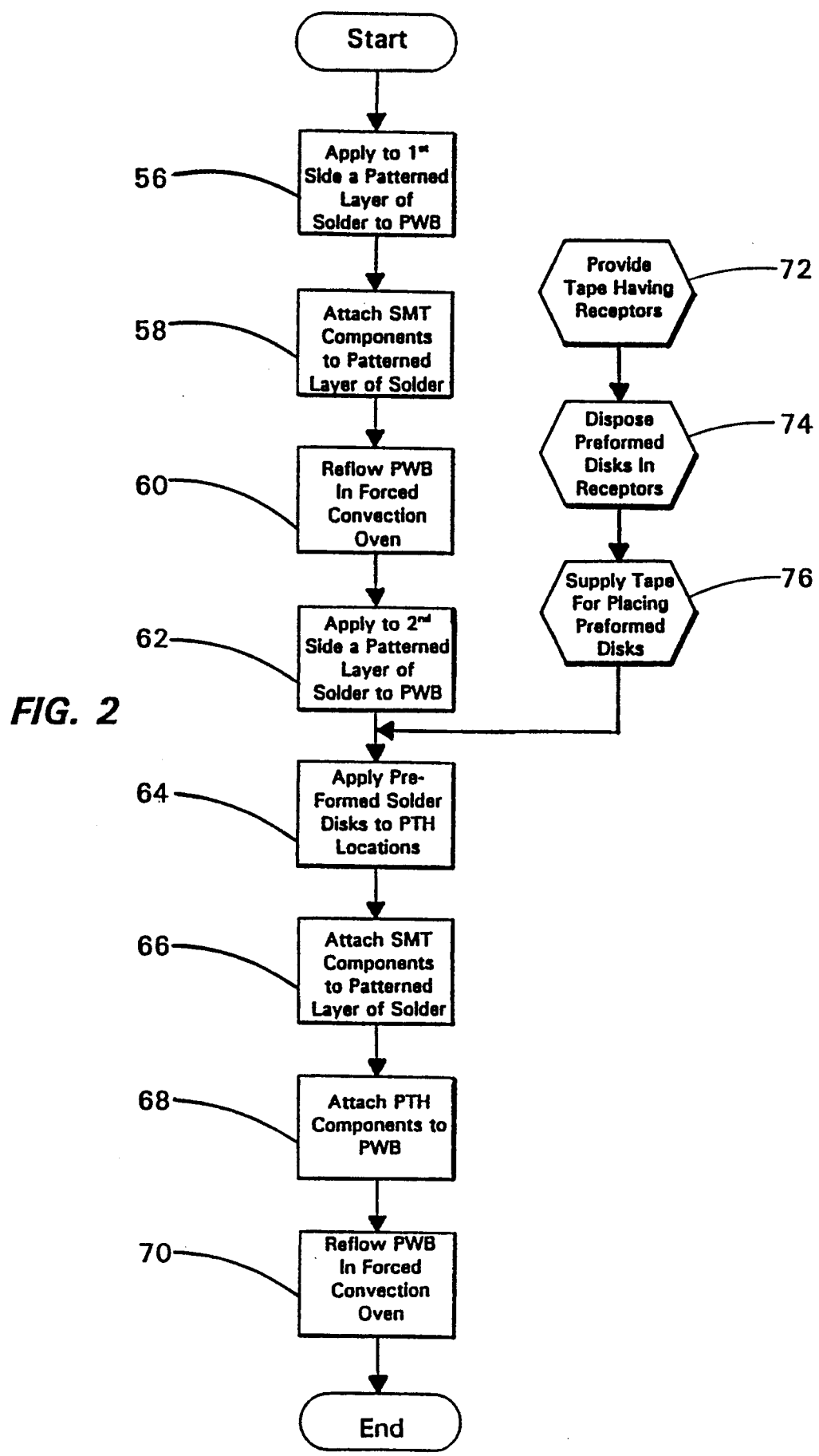
FIG. 2 is a process flow diagram of a further embodiment of the instant invention illustrating a method of combining a plurality of surface mount technology components and at least one plated through-hole component on a double sided printed wiring board.
Figure 6:
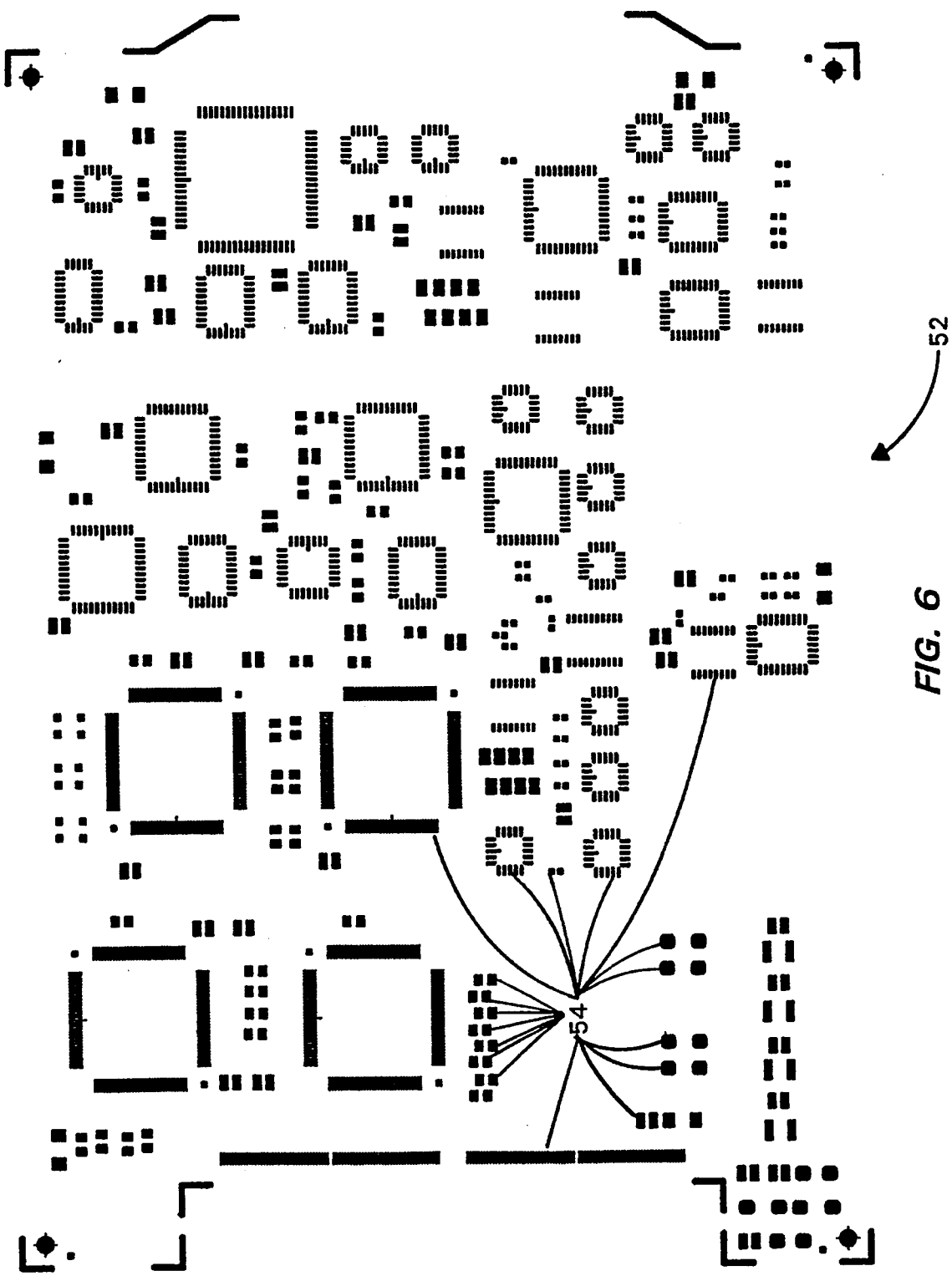
FIG. 6 is a schematic of a stencil used to apply a patterned layer of solder paste to a secondary side of a printed wiring board constructed in accordance with the instant invention.

As illustrated in the further embodiment of FIG. 2, a method of combining a plurality of surface mount technology components 20 and at least one plated through-hole component 22 on two sides 24, 50 (FIG. 9) of a printed wiring board 26 comprises the first step 56 (FIG. 2) of applying to a secondary side 50 (FIG. 9) of the printed wiring board 26 a first layer of a first preselected quantity of electrically conductive adhesive, such as a patterned layer of solder paste 30 (FIG. 7). The solder paste, preferably RMA solder paste of approximately 90 percent metal content, although higher or lower concentrations may be appropriate based on the specific application, is applied using a stencil 52 (FIG. 6). The stencil 52, preferably made from micro-polished stainless steel, has apertures 54 which allow for the solder paste to be deposited in the appropriate surface mount technology component locations on the secondary side 50 (FIG. 9) of the printed wiring board 26.

In the next step 58 illustrated in FIG. 2, a first portion of the plurality of surface mount technology components 20 (FIG. 9) are then attached to the solder paste in the appropriate surface mount technology component locations on the printed wiring board 26. In the next step 60 of FIG. 2, the secondary side 50 of the printed wiring board 26 is then reflowed through, for example, a forced convection oven (not shown); although, other reflow methods, such as infrared or vapor-phase, may be employed as appropriate. This reflow process adheres the plurality of surface mount technology components 20 to the secondary side 50 of the printed wiring board 26. The preferred reflow profile requires a minimum dwell time above liquidus of approximately 60 seconds, with a minimum temperature of approximately 220° C. and a maximum temperature of approximately 230° C. at any point on the printed wiring board 26.

Figure 3:
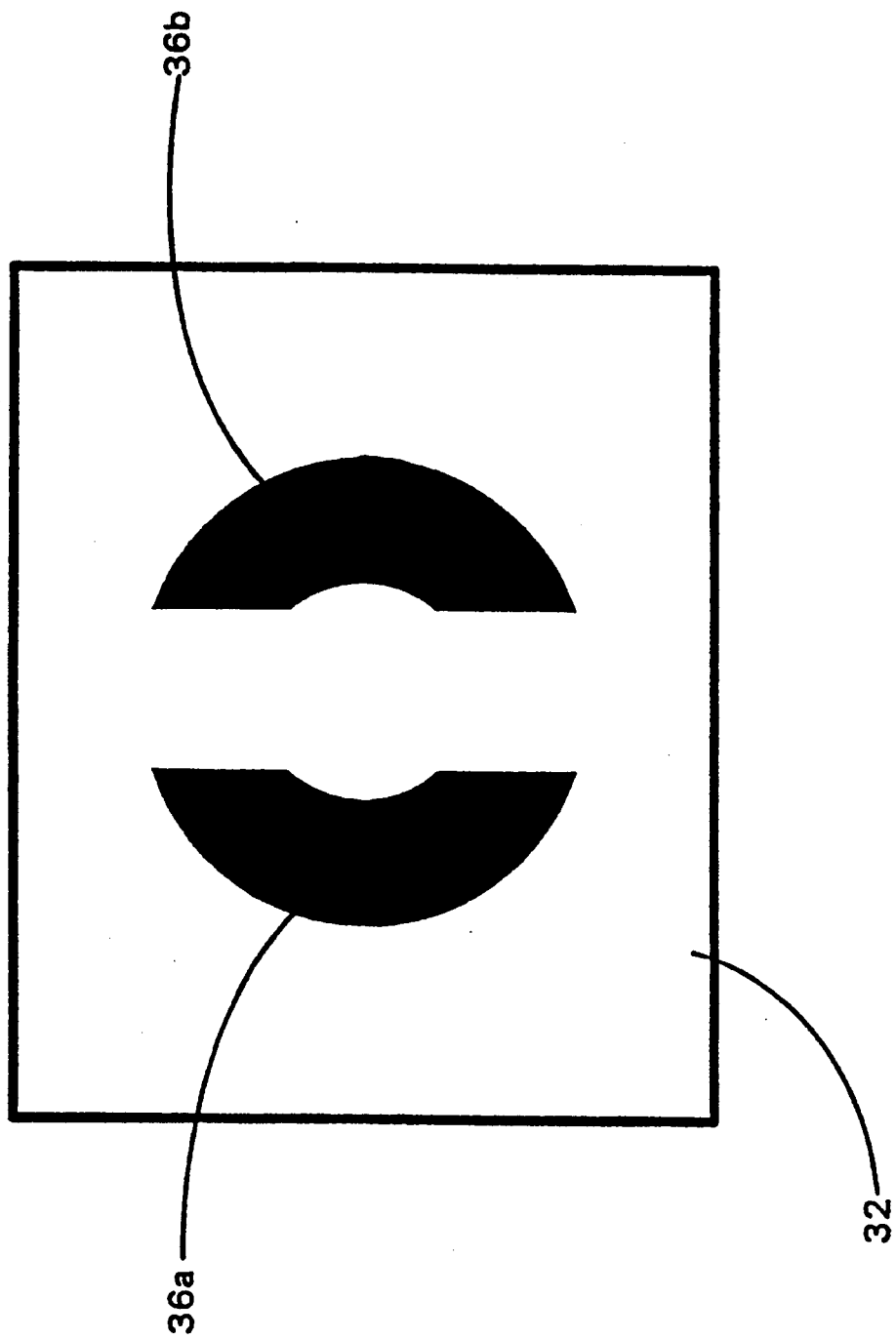
FIG. 3 illustrates a custom solder paste stencil having an aperture for preformed application in accordance with the instant invention.
Figure 5:
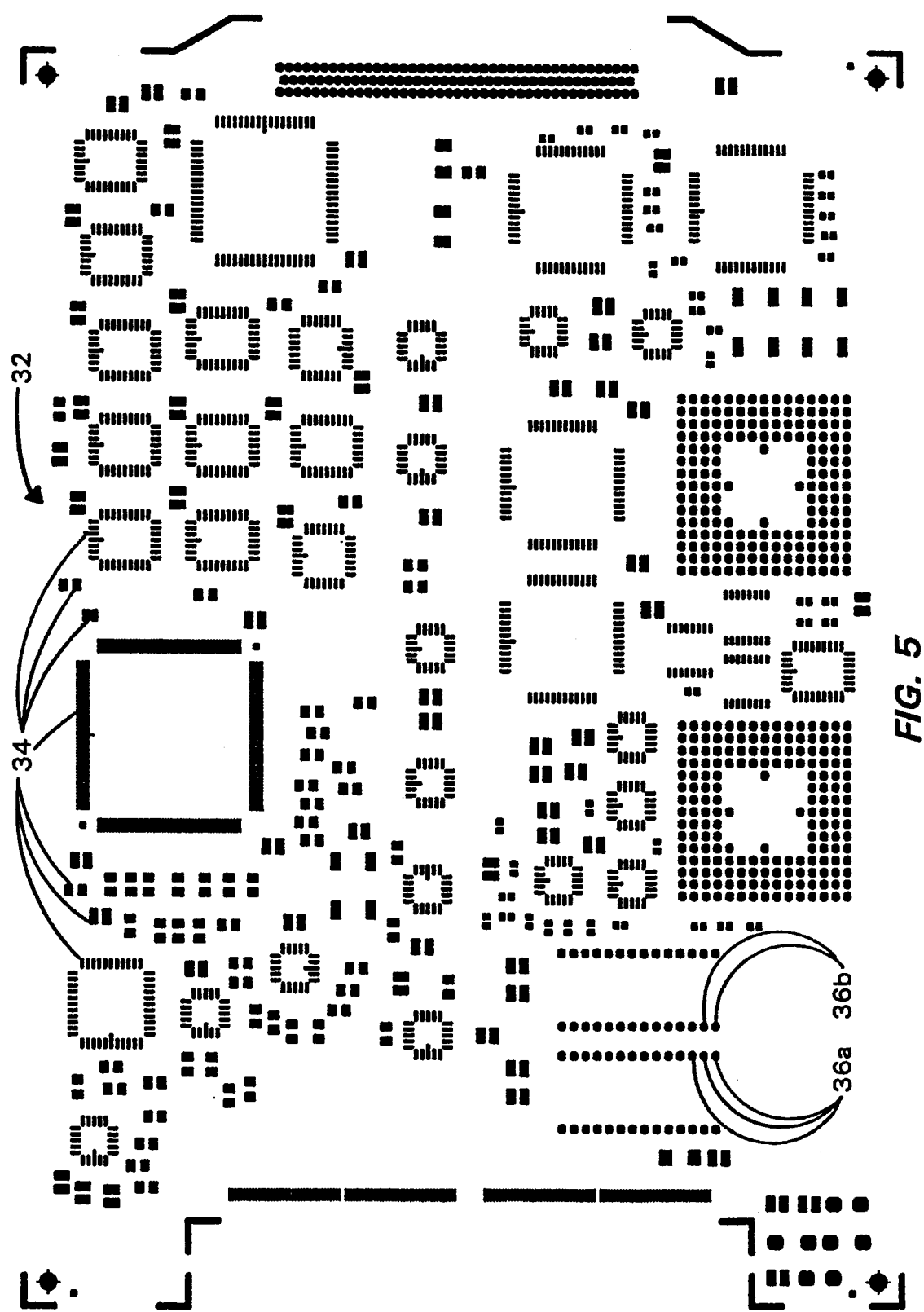
FIG. 5 is a schematic diagram of a stencil used to apply a patterned layer of solder paste to a primary side of a printed wiring board constructed in accordance with the instant invention.

In the next step 62 of the process of FIG. 2, a second layer of the first preselected quantity of electrically conductive adhesive, such as a patterned layer of solder paste, is then applied to a primary side of the printed wiring board using a second stencil 32 (FIG. 5). This stencil 32, which also is preferably made from micro-polished stainless steel, has apertures 34 which allow for the solder paste to be deposited in the appropriate SMT component locations. The stencil further defines two axially symmetric "C" shaped apertures 36a, 36b, as shown in FIG. 3, which allow the plated through-hole component hole locations to receive two axially symmetric "C" shaped deposits of solder paste 38a, 38b (see FIG. 7) on their annular rings.

In the next step 64 of FIG. 2, a second preselected quantity of electrically conductive adhesive, such as a plurality of preformed solder disks 42 (FIG. 7), are applied to the primary side 24 (FIG. 8) of the printed wiring board 26. In preparation for this step 64, however, three steps 72, 74, 76 are first completed. First 72, a tape 78 (FIG. 10) having a plurality of sequentially spaced receptors 80 located therein is provided. Next 74, a plurality of preformed solder disks 42 are disposed within the plurality of sequentially spaced receptors 80. Finally 76, the tape 78, having the plurality of preformed solder disks 42 disposed within the plurality of sequentially spaced receptors 80, is supplied by a plurality of tractor feed holes 82 to an apparatus (not shown) for placing the plurality of preformed solder disks 42 on the printed wiring board 26. These preformed solder disks 42 are then placed at the appropriate through-hole locations on top of the two axially symmetric "C" shaped deposits 38 of solder paste, which provide the "tack" to allow the preforms to remain in position. That is to say, a portion of the first preselected quantity of electrically conductive adhesive is utilized to retain the second preselected quantity of electrically conductive adhesive to the same side 24 (FIG. 8) of the printed wiring board 26.

In the next step 66 illustrated in FIG. 2, the plurality of surface mount technology components 20 are attached to the solder paste at the appropriate locations on the printed wiring board 26. The plated through-hole component 22 is attached to the appropriate locations on the printed wiring board 26 by inserting its leads through the preformed solder disks 42 (FIG. 7) and into the hole 46 on the printed wiring board 26 as shown in step 68 of FIG. 2.

In the final step 70 illustrated in FIG. 2, the primary side 24 of the printed wiring board 26 is then reflowed through, for example, a force convection oven (not shown); although, other reflow methods, such as infrared or vapor-phase, may be employed as appropriate to the specific application. This reflow process step 70 adheres the plurality of surface mount technology components 20 (see FIG. 8) and the plated through-hole component 22 to the primary side 24 of the printed wiring board 26. The preferred reflow profile requires a minimum dwell time above liquidus of approximately 60 seconds, with a minimum temperature of approximately 220° C. and a maximum temperature of approximately 230° C. at any point on the printed wiring board 26.

Figure 4:
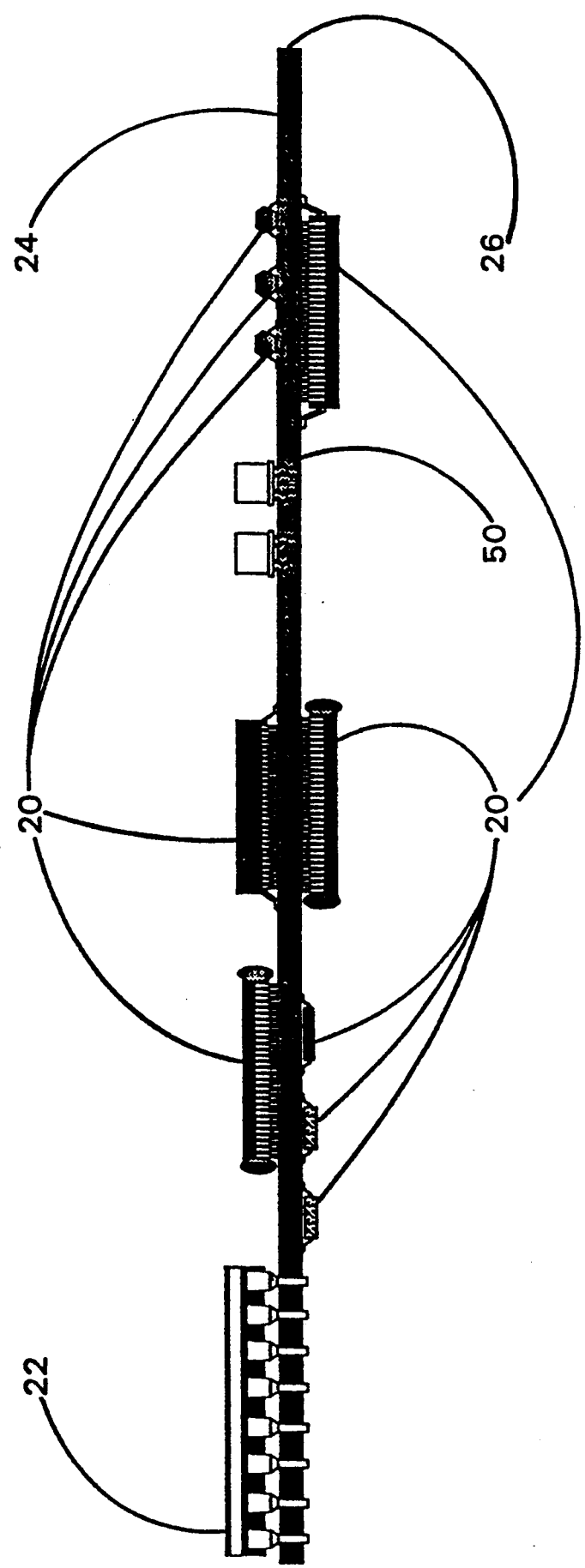
FIG. 4 is a partial cross-sectional view of a printed wiring board constructed in accordance with the instant invention.
Figure 8:
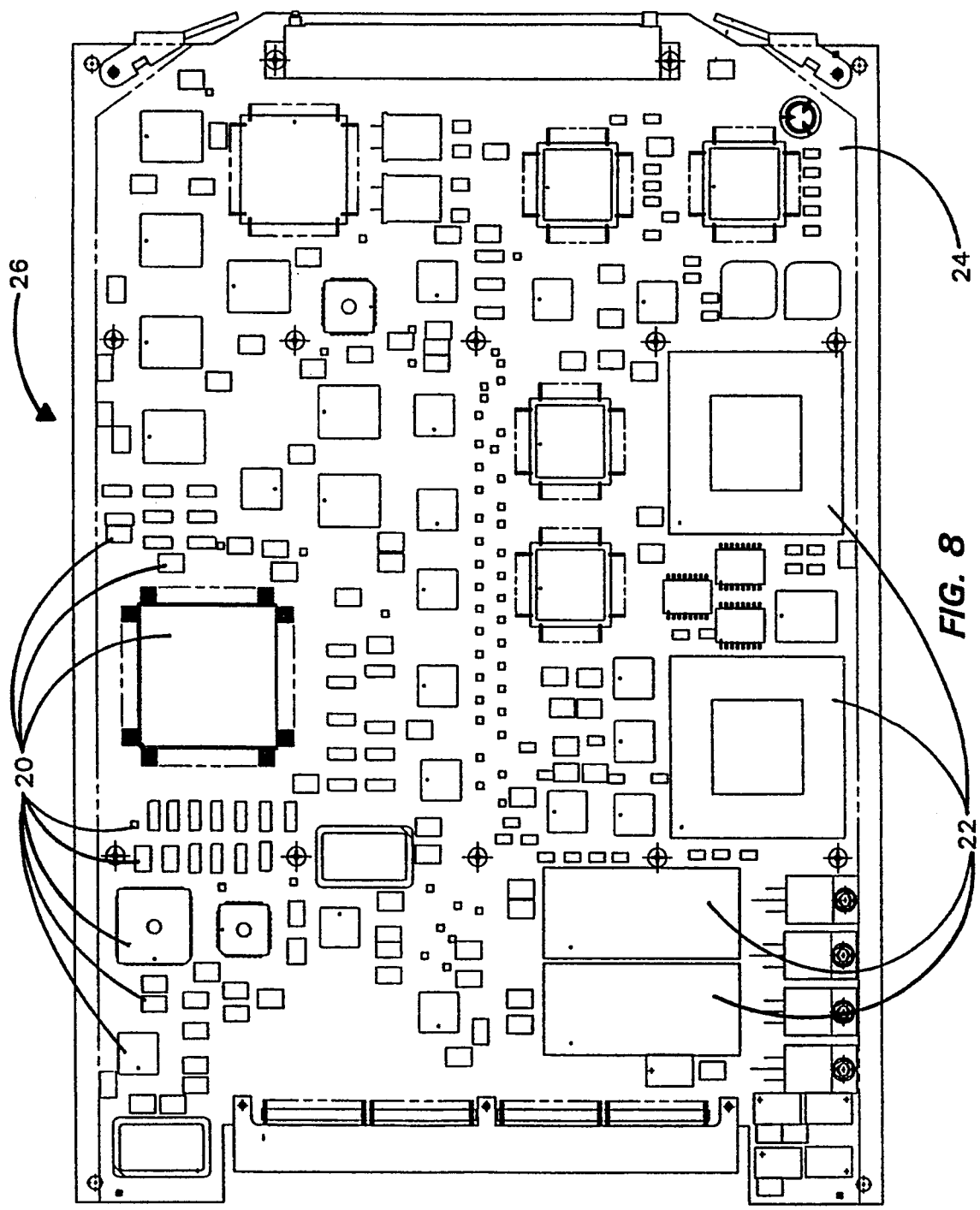
FIG. 8 is a schematic diagram of a primary side of a printed wiring board constructed in accordance with the instant invention.
Figure 9:
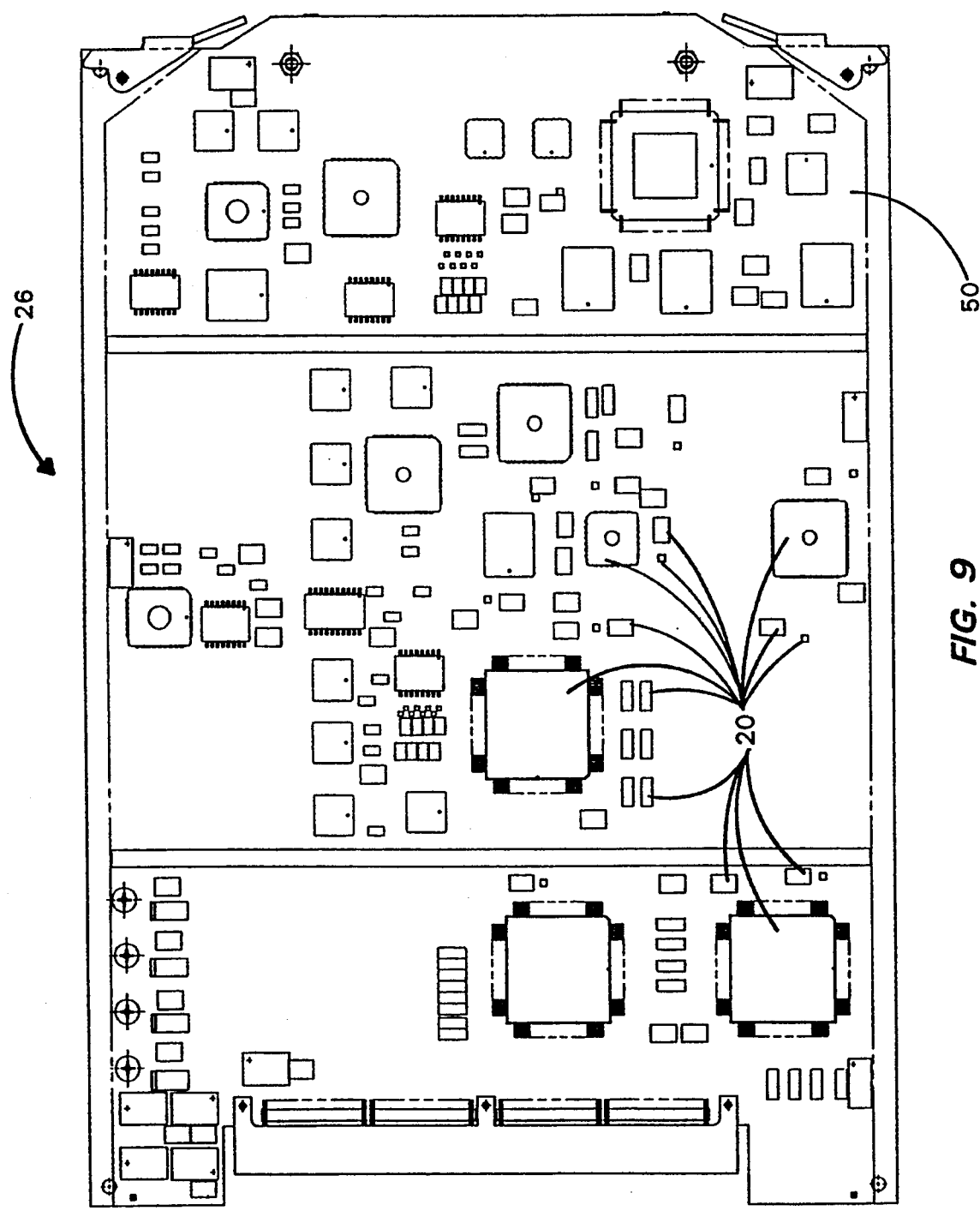
FIG. 9 is a schematic of a secondary side of a printed wiring board constructed in accordance with the instant invention.

The resulting double-sided printed wiring board 26 having surface mount technology components 20 on a secondary side 50 and both surface mount technology components 20 and plated through-hole technology component 22 on a primary side 24 is illustrated in cross section in FIG. 4. An embodiment of the physical layout of the primary side 24 of a printed wiring board 26 made in accordance with the present invention is illustrated in FIG. 8, and FIG. 9 illustrates a secondary side 50 of the printed wiring board 26.

Figure 10:
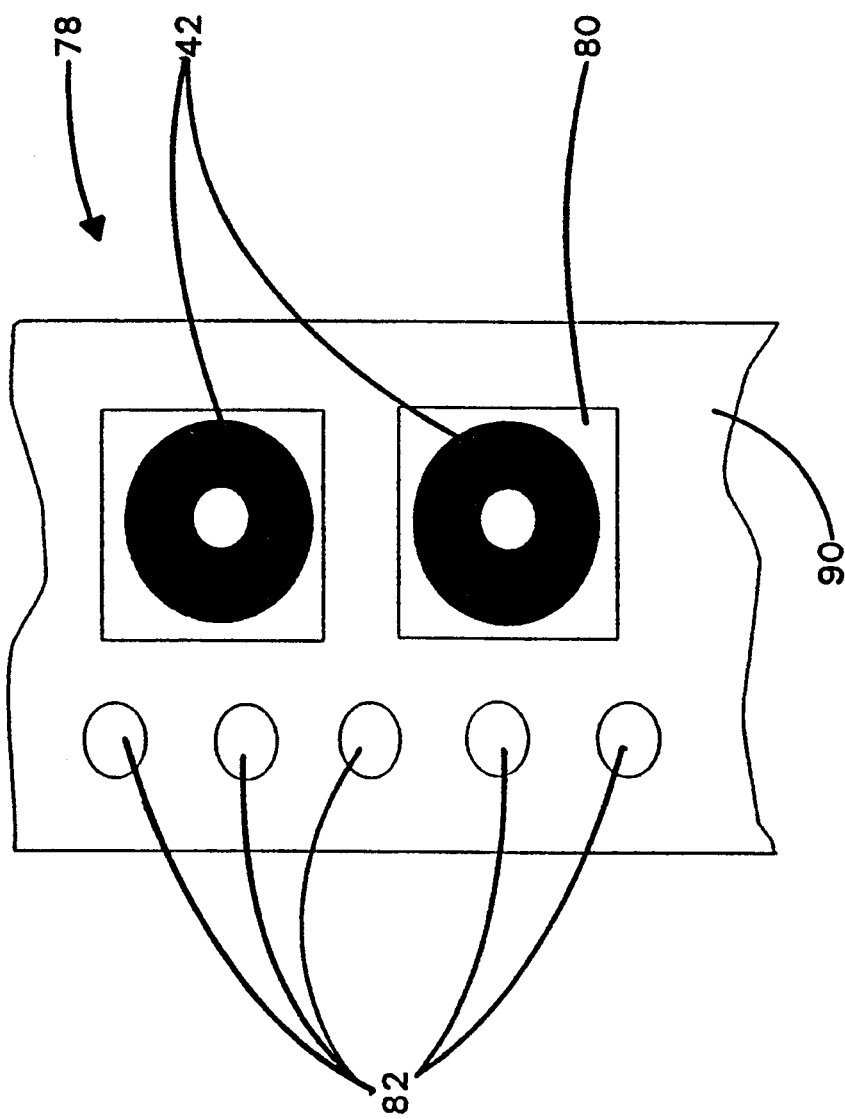
FIG. 10 is a partial schematic view of a tape used in the process of manufacture to dispense solder preforms in accordance with the instant invention.
Figure 11:
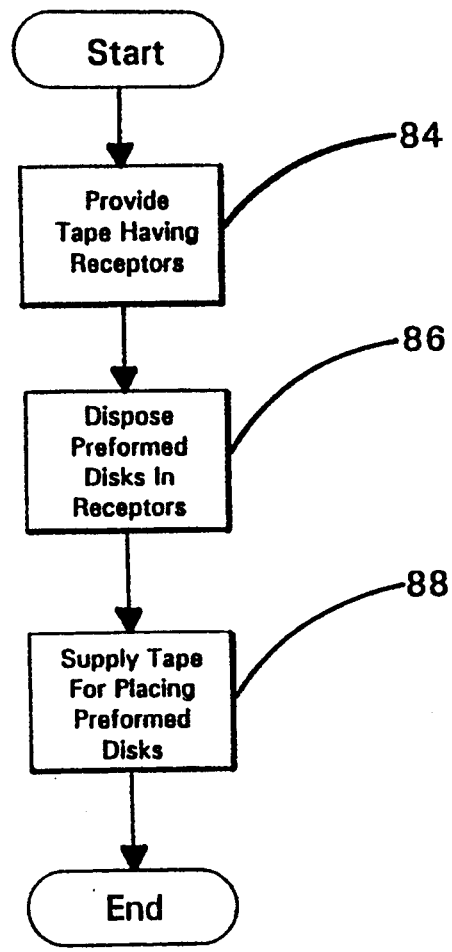
FIG. 11 is a process flow diagram of an embodiment of the instant invention illustrating a method of manufacture of a printed wiring board.

A method of manufacturing for a printed wiring board 26 is illustrated in FIG. 11. The first step 84 of this method comprises providing a tape 78 having a plurality of sequentially spaced receptors 80 located therein. Next 86, a plurality of preformed solder disks 42 (FIG. 10) are disposed within the plurality of sequentially spaced receptors 80. Finally 88, the tape 78 is supplied to an apparatus (not shown) for placing the plurality of preformed solder disks 42 on the printed wiring board 26.

A tape 78, as illustrated in FIG. 10, used in the manufacture of a printed wiring board 26, comprises a flexible material 90 having a plurality of sequentially spaced receptors 80 and tractor feed holes 82 located therein. A plurality of preformed solder disks 42 are disposed within the plurality of sequentially spaced receptors 80 of the flexible material 90. The plurality of preformed solder disks 42 disposed within the plurality of sequentially spaced receptors are capable of being supplied to an apparatus (not shown) for placement on the printed wiring board 26 (FIG. 8).

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. The details of the structure may be varied substantially without departing from the spirit of the invention, and the exclusive use of all modifications which come within the scope of the appended claims is reserved.

I claim:

1. A method of combining a plurality of surface mount technology components and at least one plated through-hole component on a printed wiring board, comprising the steps of:

applying to a secondary side of the printed wiring board a first layer of a first preselected quantity of electrically conductive adhesive;

attaching a first portion of the plurality of surface mount technology components to the first layer of the first preselected quantity of electrically conductive adhesive;

reflowing the first layer of the first preselected quantity of electrically conductive adhesive applied to the printed wiring board, thereby adhering the first portion of the plurality of board, thereby adhering the first portion of secondary side of the printed wiring board;

applying to a primary side of the printed wiring board a second layer of the first preselected quantity of electrically conductive adhesive;

applying to the primary side of the printed wiring board a second preselected quantity of electrically conductive adhesive, the step of applying the second preselected quantity of electrically conductive adhesive to the primary side of the printed wiring board including applying a plurality of preformed solder disks;

attaching a second portion of the plurality of surface mount technology components to the second layer of the first preselected quantity of electrically conductive adhesive and the plated through-hole component to the second preselected quantity of electrically conductive adhesive applied to the primary side of the printed wiring board; and reflowing the second layer of the first preselected quantity of electrically conductive adhesive and the second preselected quantity of electrically conductive adhesive applied to the printed wiring board, thereby adhering the second portion of the plurality of surface mount technology components and the plated through-hole component to the primary side of the printed wiring board.

2. The method of claim 1, including the steps of providing a tape having a plurality of sequentially spaced receptors located therein;

disposing a plurality of preformed solder disks within the plurality of sequentially spaced receptors; and supplying the tape having the plurality of preformed solder disks disposed within the plurality of sequentially spaced receptors to an apparatus for placing the plurality of preformed solder disks on the printed wiring board.

3. A method of combining a plurality of surface mount technology components and at least one plated through-hole component on a printed wiring board, comprising the steps of:

applying to a side of the printed wiring board a first preselected quantity of electrically conductive adhesive, the step of applying the first preselected quantity of electrically conductive adhesive including applying a patterned layer of solder, the step of applying the patterned layer of solder including applying a plurality of axially symmetric C-shaped deposits as a portion of the patterned layer of solder;

applying to the same side of the printed wiring board a second preselected quantity of electrically conductive adhesive;

attaching the plurality of surface mount technology components to the first preselected quantity of electrically conductive adhesive and the plated through-hole component to the second preselected quantity of electrically conductive adhesive; and reflowing the first preselected quantity of electrically conductive adhesive and the second preselected quantity of electrically conductive adhesive applied to the printed wiring board, thereby adhering the plurality of surface mount technology components and the plated through-hole component to the same side of the printed wiring board.

4. The method of claim 3, wherein the step of applying the patterned layer of solder includes using a stencil.

5. A method of combining a plurality of surface mount technology components and at least one plated through-hole component on a printed wiring board, comprising the steps of:

applying to a side of the printed wiring board a first preselected quantity of electrically conductive adhesive, the step of applying the first preselected quantity of electrically conductive adhesive including applying a patterned layer of solder, the step of applying the patterned layer of solder including applying a plurality of axially symmetric C-shaped deposits as a portion of the patterned layer of solder;

applying to the same side of the printed wiring board a second preselected quantity of electrically conductive adhesive, the step of applying the second preselected quantity of electrically conductive adhesive including applying a plurality of preformed solder disks;

attaching the plurality of surface mount technology components to the first preselected quantity of electrically conductive adhesive and the plated through-hole component to the second preselected quantity of electrically conductive adhesive; and reflowing the first preselected quantity of electrically conductive adhesive and the second preselected quantity of electrically conductive adhesive applied to the printed wiring board, thereby adhering the plurality of surface mount technology components and the plated through-hole component to the same side of the printed wiring board.

6. A method of combining a plurality of surface mount technology components and at least one plated through-hole component on a printed wiring board, comprising the steps of:

applying to a side of the printed wiring board a first preselected quantity of electrically conductive adhesive, the step of applying the first preselected quantity of electrically conductive adhesive including applying a patterned layer of solder;

applying to the same side of the printed wiring board a second preselected quantity of electrically conductive adhesive, the step of applying the second preselected quantity of electrically conductive adhesive including applying a plurality of preformed solder disks;

attaching the plurality of surface mount technology components to the first preselected quantity of electrically conductive adhesive and the plated through-hole component to the second preselected quantity of electrically conductive adhesive; and reflowing the first preselected quantity of electrically conductive adhesive and the second preselected quantity of electrically conductive adhesive applied to the printed wiring board, thereby adhering the plurality of surface mount technology components and the plated through-hole component to the same side of the printed wiring board.

7. The method of claim 6, wherein the step of applying the patterned layer of solder includes utilizing a portion of the patterned layer of solder to retain the plurality of preformed solder disks to the same side of the printed wiring board.

8. A method of combining a plurality of surface mount technology components and at least one plated through-hole component on a printed wiring board, comprising the steps of:

applying to a side of the printed wiring board a first preselected quantity of electrically conductive adhesive;

applying to the same side of the printed wiring board a second preselected quantity of electrically conductive adhesive, the step of applying the first preselected quantity of electrically conductive adhesive including utilizing a portion of the first quantity of electrically conductive adhesive to retain the second preselected quantity of electrically conductive adhesive to the same side of the printed wiring board;

attaching the plurality of surface mount technology components to the first preselected quantity of electrically conductive adhesive and the plated through-hole component to the second preselected quantity of electrically conductive adhesive; and reflowing the first preselected quantity of electrically conductive adhesive and the second preselected quantity of electrically conductive adhesive applied to the printed wiring board, thereby adhering the plurality of surface mount technology components and the plated through-hole component to the same side of the printed wiring board.

9. A method of combining a plurality of surface mount technology components and at least one plated through-hole component on a printed wiring board, comprising the steps of:

applying to a side of the printed wiring board a first preselected quantity of electrically conductive adhesive;

applying to the same side of the printed wiring board a second preselected quantity of electrically conductive adhesive, the step of applying the second preselected quantity of electrically conductive adhesive including applying a plurality of preformed solder disks;

attaching the plurality of surface mount technology components to the first preselected quantity of electrically conductive adhesive and the plated through-hole component to the second preselected quantity of electrically conductive adhesive; and reflowing the first preselected quantity of electrically conductive adhesive and the second preselected quantity of electrically conductive adhesive applied to the printed wiring board, thereby adhering the plurality of surface mount technology components and the plated through-hole component to the same side of the printed wiring board.

10. A method of combining a plurality of surface mount technology components and at least one plated through-hole component on a printed wiring board, comprising the steps of:

applying to a secondary side of the printed wiring board a first layer of a first preselected quantity of electrically conductive adhesive;

attaching a first portion of the plurality of surface mount technology components to the first layer of the first preselected quantity of electrically conductive adhesive;

reflowing the first layer of the first preselected quantity of electrically conductive adhesive applied to the printed wiring board, thereby adhering the first portion of the plurality of surface mount technology components to the secondary side of the printed wiring board;

applying to a primary side of the printed wiring board a second layer of the first preselected quantity of electrically conductive adhesive;

applying to the primary side of the printed wiring board a second preselected quantity of electrically conductive adhesive;

attaching a second portion of the plurality of surface mount technology components to the second layer of the first preselected quantity of electrically conductive adhesive and the plated through-hole component to the second preselected quantity of electrically conductive adhesive applied to the primary side of the printed wiring board; and reflowing the second layer of the first preselected quantity of electrically conductive adhesive and the second preselected quantity of electrically conductive adhesive applied to the printed wiring board, thereby adhering the second portion of the plurality of surface mount technology components and the plated through-hole component to the primary side of the printed wiring board.

11. The method of claim 10, wherein the steps of applying the first layer and the second layer of the first preselected quantity of electrically conductive adhesive to the secondary side and the primary side, respectively, of the printed wiring board comprise applying a first patterned layer of solder and a second patterned layer of solder, respectively.

12. The method of claim 11, wherein the step of applying the second patterned layer of solder includes applying a plurality of axially symmetric C-shaped deposits as a portion of the second patterned layer of solder.

13. The method of claim 12, wherein the steps of applying the first patterned layer of solder and the second patterned layer of solder include using a stencil.

14. A method of combining a plurality of surface mount technology components and at least one plated through-hole component on a printed wiring board, comprising the steps of:

applying to a second side of the printed wiring board a first layer of a first preselected quantity of electrically conductive adhesive, the step of applying the first layer of the first preselected quantity of electrically conductive adhesive including applying a first patterned layer of solder;

attaching a first portion of the plurality of surface mount technology components to the first layer of the first preselected quantity of electrically conductive adhesive;

reflowing the first layer of the first preselected quantity of electrically conductive adhesive applied to the printed wiring board, thereby adhering the first portion of the plurality of surface mount technology components to the secondary side of the printed wiring board;

applying to a primary side of the printed wiring board a second layer of the first preselected quantity of electrically conductive adhesive, the step of applying the second layer of the first preselected quantity of electrically conductive adhesive including applying a second patterned layer of solder, the step of applying the second patterned layer of solder including applying a plurality of axially symmetric C-shaped deposits as a portion of the second patterned layer of solder;

applying to the primary side of the printed wiring board a second preselected quantity of electrically conductive adhesive, the step of applying the second preselected quantity of electrically conductive adhesive to the primary side of the printed wiring board including applying a plurality of preformed solder disks;

attaching a second portion of the plurality of surface mount technology components to the second layer of the first preselected quantity of electrically conductive adhesive and the plated through-hole component to the second preselected quantity of electrically conductive adhesive applied to the primary side of the printed wiring board; and reflowing the second layer of the first preselected quantity of electrically conductive adhesive and the second preselected quantity of electrically conductive adhesive applied to the printed wiring board, thereby adhering the second portion of the plurality of surface mount technology components and the plated through-hole component to the primary side of the printed wiring board.

15. A method of combining a plurality of surface mount technology components and at least one plated through-hole component on a printed wiring board, comprising the steps of:

applying to a secondary side of the printed wiring board a first layer of a first preselected quantity of electrically conductive adhesive, the step of applying the first layer of the first preselected quantity of electrically conductive adhesive including applying a first patterned layer of solder;

attaching a first portion of the plurality of surface mount technology components to the first layer of the first preselected quantity of electrically conductive adhesive;

reflowing the first layer of the first preselected quantity of electrically conductive adhesive applied to the printed wiring board, thereby adhering the first portion of the plurality of surface mount technology components to the secondary side of the printed wiring board;

applying to a primary side of the printed wiring board a second layer of the first preselected quantity of electrically conductive adhesive, the step of applying the second layer of the first preselected quantity of electrically conductive adhesive including applying a second patterned layer of solder;

applying to the primary side of the printed wiring board a second preselected quantity of electrically conductive adhesive, the step of applying the second preselected quantity of electrically conductive adhesive to the primary side of the printed wiring board including applying a plurality of preformed solder disks;

attaching a second portion of the plurality of surface mount technology components to the second layer of the first preselected quantity of electrically conductive adhesive and the plated through-hole component to the second preselected quantity of electrically conductive adhesive applied to the primary side of the printed wiring board; and reflowing the second layer of the first preselected quantity of electrically conductive adhesive and the second preselected quantity of electrically conductive adhesive applied to the printed wiring board, thereby adhering the second portion of the plurality of surface mount technology components and the plated through-hole component to the primary side of the printed wiring board.

16. The method of claim 15, wherein the step of applying the second patterned layer of solder includes utilizing a portion of the second patterned layer of solder to retain the plurality of preformed solder disks to the primary side of the printed wiring board.

17. A method of combining a plurality of surface mount technology components and at least one plated through-hole component on a printed wiring board, comprising the steps of:

applying to a secondary side of the printed wiring board a first layer of a first preselected quantity of electrically conductive adhesive;

attaching a first portion of the plurality of surface mount technology components to the first layer of the first preselected quantity of electrically conductive adhesive;

reflowing the first layer of the first preselected quantity of electrically conductive adhesive applied to the printed wiring board, thereby adhering the first portion of the plurality of surface mount technology components to the secondary side of the printed wiring board;

applying to a primary side of the printed wiring board a second layer of the first preselected quantity of electrically conductive adhesive;

applying to the primary side of the printed wiring board a second preselected quantity of electrically conductive adhesive, the step of applying the second layer of the first preselected quantity of electrically conductive adhesive including utilizing a portion of the first preselected quantity of electrically conductive adhesive to retain the second preselected quantity of electrically conductive adhesive to the primary side of the printed wiring board;

attaching a second portion of the plurality of surface mount technology components to the second layer of the first preselected quantity of electrically conductive adhesive and the plated through-hole component to the second preselected quantity of electrically conductive adhesive applied to the primary side of the printed wiring board; and reflowing the second layer of the first preselected quantity of electrically conductive adhesive and the second preselected quantity of electrically conductive adhesive applied to the printed wiring board, thereby adhering the second portion of the plurality of surface mount technology components and the plated through-hole component to the primary side of the printed wiring board.

* * * * *